US011336236B2

(12) United States Patent
Lambrecht et al.

(10) Patent No.: US 11,336,236 B2
(45) Date of Patent: May 17, 2022

(54) DIFFERENTIAL TRANSIMPEDANCE AMPLIFIER

(71) Applicants: UNIVERSITEIT GENT, Ghent (BE); IMEC VZW, Leuven (BE)

(72) Inventors: Joris Lambrecht, Oudenaarde (BE); Hannes Ramon, Gent-Zwijnaarde (BE); Bart Moeneclaey, Ghent (BE); Xin Yin, Sint-Denijs-Westrem (BE)

(73) Assignees: UNIVERSITEIT GENT, Ghent (BE); IMEC VZW, Leuven (BE)

( * ) Notice: Subject to any disclaimer, the term of this patent is extended or adjusted under 35 U.S.C. 154(b) by 0 days.

(21) Appl. No.: 16/981,864

(22) PCT Filed: Mar. 20, 2019

(86) PCT No.: PCT/EP2019/056981
§ 371 (c)(1),
(2) Date: Sep. 17, 2020

(87) PCT Pub. No.: WO2019/180091
PCT Pub. Date: Sep. 26, 2019

(65) Prior Publication Data
US 2021/0126594 A1    Apr. 29, 2021

(30) Foreign Application Priority Data

Mar. 20, 2018  (EP) .................... 18163000

(51) Int. Cl.
*H03F 3/45* (2006.01)
*H03F 3/08* (2006.01)
(Continued)

(52) U.S. Cl.
CPC ............ *H03F 3/082* (2013.01); *H03F 1/086* (2013.01); *H03F 3/45663* (2013.01); *H03G 3/3084* (2013.01)

(58) Field of Classification Search
CPC ...... H03F 3/082; H03F 1/086; H03F 3/45663; H03F 2203/45428; H03F 2203/45561;
(Continued)

(56) References Cited

U.S. PATENT DOCUMENTS 5,343,160 A    8/1994  Taylor
8,478,138 B2 *  7/2013  Sugawara ............ H04B 10/677
                                                  398/210
(Continued)

FOREIGN PATENT DOCUMENTS

JP    2011171812 A    9/2011

OTHER PUBLICATIONS

International Search Report and Written Opinion from PCT Application No. PCT/EP2019/056981, dated Apr. 25, 2019.
(Continued)

*Primary Examiner* — Khanh V Nguyen
*Assistant Examiner* — Khiem D Nguyen
(74) *Attorney, Agent, or Firm* — Workman Nydegger

(57) ABSTRACT

A transimpedance amplifier is provided for converting a current between its two input terminals to a voltage over its two output terminals comprising a high-speed level shifter configured for creating a difference in input DC voltage and for being transparent for alternating voltages, an input biasing network configured for reverse biasing a photodiode connected to at least one of the input terminals and transparent for a feedback signal from the feedback network which is differentially and DC-coupled with the output terminals of the voltage amplifier and outputs of the feedback network are differentially and DC-coupled with the input biasing network of which outputs are coupled with inputs of the level shifter which is differentially and DC-coupled with input terminals of the voltage amplifier.

12 Claims, 10 Drawing Sheets

(51) Int. Cl.
*H03F 1/08* (2006.01)
*H03G 3/30* (2006.01)

(58) Field of Classification Search
CPC ........... H03F 2203/45564; H03F 2203/45626; H03F 3/087; H03F 3/45183; H03F 3/45475; H03F 3/45645; H03F 3/45659; H03F 1/08; H03G 3/3084
USPC .................................................. 330/252–261
See application file for complete search history.

(56) References Cited

U.S. PATENT DOCUMENTS

| | | |
|---|---|---|
| 8,872,585 B2 | 10/2014 | Sugimoto |
| 9,496,964 B2 | 11/2016 | Sinsky et al. |
| 2012/0281991 A1 | 11/2012 | Sugimoto |
| 2014/0097331 A1 | 4/2014 | Tsunoda |
| 2014/0145789 A1 | 5/2014 | Sugimoto |
| 2017/0338782 A1 | 11/2017 | Welch |

OTHER PUBLICATIONS

Extended Search Report from corresponding EP Application No. EP18163000.5, dated Sep. 27, 2018.

* cited by examiner

DIFFERENTIAL TRANSIMPEDANCE AMPLIFIER

CROSS-REFERENCE TO RELATED APPLICATIONS

Not Applicable.

FIELD OF THE INVENTION

The present invention relates to the field of transimpedance amplifiers. More specifically it relates to transimpedance amplifiers which can be deployed in datacenter applications as well as in coherent links.

BACKGROUND OF THE INVENTION

In high-speed transimpedance amplifier (TIA) design for broadband optical communications, the ever-increasing demand for more bandwidth and less power consumption forces design trade-offs, typically reducing gain and sacrificing noise performance.

The best noise performance has traditionally been obtained with shunt-feedback (SFB) transimpedance amplifiers (TIA) Other topologies, such as the common gate TIA, the regulated cascade (RGC) TIA or invertor TIAs in CMOS, promise advantages—such as a higher bandwidth, a larger obtainable transimpedance or strongly reduced complexity and power consumption—but at the cost of a large noise penalty, poor power supply rejection (PSRR), and less tunability.

For higher-end applications, shunt-feedback (SFB) TIAs are most often the topology of choice (see the schematic drawing in FIG. 1). Even with the SFB topology, there is a limit on the combination of transimpedance (noise) and bandwidth that can be obtained, as given by the transimpedance limit (Broadband circuits of optical fiber communication, E. Sackinger, ISBN: 9780471712336, p. 117).

$$R_T \leq \frac{A \cdot f_A}{2\pi C_T BW_{3dB}^2}$$

In this equation $R_T$ is the effective transimpedance, A is the open loop gain of the error voltage amplifier, $C_T$ denotes the total input capacitance and $BW_{3dB}$ is the total closed loop bandwidth of the TIA stage. According to this limit, doubling the bandwidth forces a reduction of $R_T$ by a factor of four, severely degrading noise performance and reducing gain. Finding ways to go past this limit proves very challenging.

Each new generation of high-speed TIAs needs a larger bandwidth to comply with increasing data rate specifications. Therefore, the input-referred noise current continues to grow. To ensure sufficient SNR, the average input signal amplitude needs to be increased. Since photodiodes are optical power detectors and provide a non-balanced output, high-speed TIAs must be able to sink or source a larger average photocurrent to have a reasonable dynamic range. High-speed optical transmitters for short-reach optical links (datacenter, e.g. EAMs) typically have a relatively low extinction ratio (e g. 6 dB or less), further increasing the average photodiode (PD) current produced to obtain the same modulated (signal) current. The average PD current cannot be neglected when sufficient dynamic range is required, and relatively strong signals need to be processed.

Transimpedance amplifiers employing feedback, such as the SFB TIA, are exposed to stability risks due to non-zero parasitic impedances to ground (e.g. emitter inductance) or supply (excessive inductive peaking or resistance, lowering the phase margin), or due to coupling between ground or supply bondwires from the same or different channels (Design of Integrated Circuits for Optical Communications, B. Razavi, p. 102).

Most often, PSRR or substrate noise rejection is not good, unless e.g. an on-chip LDO (low-dropout) voltage regulator and/or dummy structures are used (extra design effort, power consumption, area). In a multichannel receiver, numerous layout measures need to be taken to limit channel-to-channel crosstalk from occurring through either substrate, power supply or ground. For example: using star-connections to provide supply and ground to channels, use isolation barriers (e.g. in BiCMOS: deep trench isolation), extensive use of guard rings and triple wells, etc.

US20170338782 and US20140097331 relate to feedback transimpedance amplifiers. In US20140097331 a light reception circuit includes a direct current (DC) level shift circuit that shifts a DC voltage level of a first signal or a second signal and outputs a third signal or a fourth signal, so that a DC voltage level of the first signal output from a cathode of a photodiode that generates a signal by photo conversion and a DC voltage level of the second signal output from an anode of the photodiode agree. In US20140097331 the level shifter is in front of a TIA. This TIA comprises the feedback path which is transparent for alternating voltages and consists of resistors which close the loop between the output and the input of the amplifier. Thus, in US20140097331 the impedance of the level shifting circuit of D1 must be much lower that the impedance of the TIA.

US20120281991, US20140145789, and JP2011171812 relate to differential transimpedance amplifiers and illustrate ways of connect photodiodes to the differential transimpedance amplifiers.

In view of the increasing demand for more bandwidth and less power consumption there is a need for TIAs that meet these needs.

SUMMARY OF THE INVENTION

It is an object of embodiments of the present invention to provide a good TIA, an optical receiver comprising such a TIA, and datacenter and coherent optical receivers comprising such a TIA.

The above objective is accomplished by a method and device according to the present invention.

In a first aspect embodiments of the present invention relate to a transimpedance amplifier for converting a current between its two input terminals, to a voltage over its two output terminals. One of the input terminals is an inverting input terminal and the other one is a non-inverting input terminal.

The transimpedance amplifier comprises a voltage amplifier, a differential DC-coupled feedback network, an input biasing network, and a high-speed level shifter. The level shifter is configured for creating a difference in DC voltage and for being transparent for alternating voltages, The input biasing network is configured for reverse biasing a photodiode or multiple photodiodes connected to at least one of the input terminals and is transparent for a feedback signal from the feedback network which is positioned between the output terminals of the voltage amplifier on one side and the biasing network and/or the level shifter on the other side.

The level shifter and the biasing network are in front of the voltage amplifier, the output terminals of the transimpedance amplifier are corresponding with the output terminals of the voltage amplifier.

In embodiments of the present invention the level shifter is differentially and DC-coupled with the input terminals of the voltage amplifier and, the feedback network is differentially coupled and DC-coupled with outputs of the voltage amplifier and outputs of the feedback network are differentially, and DC coupled with the input biasing network. The input biasing network comprises the input terminals and, outputs of the input biasing network are coupled with inputs of the level shifter and the input terminals of the transimpedance amplifier are corresponding with the input terminals of the biasing network.

It is an advantage of embodiments of the present invention that a differential TIA is realized by putting a level shifter in front of the voltage amplifier and by combining it with a feedback network.

Having the level shifter in front of the voltage amplifier has as advantage that the level shifter allows to create a DC voltage between both inputs of the TIA, without having to increase the supply voltage of the TIA core (the error voltage amplifier) which would increase power consumption significantly. This allows to connect (a) photodiode(s) in different ways. It allows for example to connect the anode and cathode of a photodiode to the input terminals of the TIA.

It is an advantage of embodiments of the present invention that the level shifter can be combined with the feedback network as this results in good noise performance combined with good bandwidth and good gain. In embodiments of the present invention the feedback network is a shunt feedback network.

It is an advantage of embodiments of the present invention that shunt-feedback is possible as this results in a good gain, a good bandwidth and low noise because of shunt-feedback topology.

It is an advantage of embodiments of the present invention that no DC blocks are required as such DC blocks need to have a large capacitance, they therefore occupy a significant amount of area and introduce parasitic capacitance by themselves.

It is an advantage that a TIA in accordance with embodiments of the present invention can be deployed in datacenter applications as well as in coherent links. In datacenter applications typically, low noise, high bandwidth TIAs are required. In coherent links moreover, linearity of the TIA is an important requirement as DSP processing in coherent links is significantly simplified in case of a linear signal.

It is an advantage of embodiments of the present invention that the TIA core supply voltage does not need to be increased as this implies that less power is required.

It is an advantage of embodiments of the present invention that the orientation of the photodiode is interchangeable without the need for requiring 3 input pads. In the present invention, only two input pads are required as it is possible to flip the photodiode because of the presence of the level shifter. This is particularly advantageous because no co-design of the photonics with the photodiodes and the electronic chip is required. In prior art TIAs this is solved by providing a TIA with 3 input pads. Because only two of them are used, this results in lost space compared to the present invention where only two input pads are required. It is therefore an advantage that a TIA according to embodiments of the present invention occupies a reduced area compared to TIAs which required 3 input pads for having the same flexibility. The photodiode channel pitch can be reduced by a factor of 1.5, this reduces the input channel width and promotes tight integration between the electrical and photonic chips.

It is an advantage of embodiments of the present invention that using the bias network it is possible to provide a DC current to a connected photodiode.

It is an advantage of embodiments of the present invention that both inputs of the TIA can sink and source current. In embodiments of the present invention this is achieved by having two current sources at each input of the TIA. One for sourcing the current and one for sinking the current (i.e. a p-type source and an n-type source). In embodiments of the present invention the sinking source may be integrated in the feedback. It is an advantage of embodiments of the present invention that it is possible to source and sink the DC current through the photodiode and this also after flipping the photodiode.

Embodiments of the present invention may be implemented in different technologies such as BiCMOS, CMOS, GaAs, etc.

In embodiments of the present invention the level shifter is transparent for alternating voltages.

In embodiments of the present invention the level shifter comprises a current source and a parallel RC chain which are configured for generating a DC voltage between the input terminals of the voltage amplifier.

As the level shifter is at the input of the voltage amplifier its capacitance is preferably as small as possible because this capacitance has a direct impact on the sensitivity and bandwidth of the TIA. It is an advantage of embodiments of the present invention that a low capacitance level shifter can be designed by combining a parallel RC chain with a low capacitance current source. The capacitance of the current source can for example be around 15 fF (including layout parasitics) because the current is relatively low (less than 1 mA). If a large current would be required that implies that large transistors are needed and therefore also the parasitics are large. With smaller currents, however, the resulting parasitics will also be smaller. In the parallel RC circuit, the resistor can for example have a resistance of 1500 Ω or more and a capacitance of 1.6 pF or even less. Increasing the resistance allows to decrease the capacitance. An increased resistance value moreover has the advantage that it allows to level shift with a decreased current. The current which can be saved in the level shifter can be used for feeding it through the photodiode. The upper resistor value is thereby restricted by the physical size and by the increased number of parasitics that come with an increasing size. The resistor value can for example be in the k range. In embodiments of the present invention the input bias voltage is tunable. When increasing the resistor value, the current needs to be decreased. This implies that the step resolution in the current also needs to be decreased to have the same bias voltage step size. The current may for example be in the range up to max. 1 mA.

It is an advantage of embodiments of the present invention that 1.4V or even higher reverse bias voltage on a single diode, connected with both inputs to the TIA, can be achieved and that a reverse bias voltage of 2.8V or even higher can be achieved on a diode connected with one input to the TIA. It is an advantage of embodiments of the present invention that it allows to source and sink up to 3 mA of photodiode current.

In embodiments of the present invention the feedback network is an active feedback network.

In embodiments of the present invention the input biasing network comprises two current sources per input terminal, one configured for sourcing current to the photodiode and one configured for sinking current from the photodiode.

In a second aspect embodiments of the present invention relate to an optical receiver comprising a transimpedance amplifier according to embodiments of the present invention, and at least one photodiode wherein the at least one photodiode is connected to at least one of the input terminals of the transimpedance amplifier.

It is an advantage of embodiments of the present invention that using the level shifter it is possible to apply a reverse bias voltage to the photodiode. For example, when a photodiode is connected to one input it is possible to reverse bias the photodiode to minimize the capacitance of the photodiode.

In embodiments of the present invention the photodiode is connected to both input terminals of the transimpedance amplifier.

It is an advantage of embodiments of the present invention that by connecting the anode and cathode of a single photodiode to the inputs of a TIA, in accordance with embodiments of the present invention, it is possible to double the gain and increase the sensitivity with max. 1.5 dB.

It is an advantage of embodiments of the present invention that a connected photodiode can be reverse biased. In such a configuration it is for example possible to apply a 1.4 V reverse bias to a single photodiode. This can for example be achieved using a level shifter comprising a current source and a parallel RC chain which are configured to generate a DC voltage between the two input terminals of the voltage amplifiers.

In embodiments of the present invention the photodiode is connected to the inverting input terminal of the transimpedance amplifier.

It is an advantage of such a configuration that 2.8V reverse biasing of the photodiode is possible without having to use large high voltage transistors. This can for example be achieved using a level shifter comprising a current source and a parallel RC chain which are configured to generate a DC voltage between the two input terminals of the voltage amplifiers. It is advantageous that such a reverse bias voltage can be achieved without having to use large high voltage transistors, which typically introduce a lot of parasitic capacitance.

In embodiments of the present invention one photodiode is connected to the inverting input terminal of the transimpedance amplifier and another photodiode is connected to the non-inverting input terminal of the transimpedance amplifier.

In embodiments of the present invention one photodiode is connected with its anode to the inverting input terminal of the transimpedance amplifier and another photodiode is connected with its cathode to the non-inverting input terminal of the transimpedance amplifier.

In embodiments of the present invention one photodiode is connected with its anode to the inverting input terminal of the transimpedance amplifier and another photodiode is connected with its cathode to the same inverting input terminal of the transimpedance amplifier (balanced photodiode configuration).

In a third aspect embodiments of the present invention relate to a datacenter optical link comprising an optical receiver in accordance with embodiments of the present invention.

It is an advantage of embodiments of the present invention that a good receiver noise can be achieved by using a TIA in accordance with embodiments of the present invention.

In a fourth aspect embodiments of the present invention relate to a passive optical network comprising an optical receiver in accordance with embodiments of the present invention.

In a fifth aspect embodiments of the present invention relate to a coherent optical receiver comprising an optical receiver in accordance with embodiments of the present invention.

In such a coherent optical receiver a DSP may be present to compensate for fiber dispersion and any (linear) channel impairment. Such a DSP implementation is easier and hence more power efficient if the link is linear. It is therefore an advantage of embodiments of the present invention that the optical receiver is a linear receiver.

In a sixth aspect embodiments of the present invention relate to an equalizer comprising a transimpedance amplifier according to embodiments of the present invention, and a plurality of photodiodes arranged in a first array connected to the non-inverting input terminal of the transimpedance amplifier and in a second array connected with the inverting input terminal of the transimpedance amplifier.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
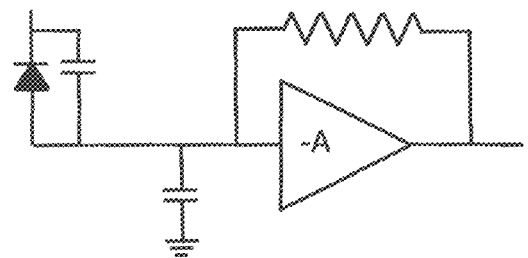
FIG. 1 shows a schematic drawing of a prior art shunt-feedback TIA.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to the input biasing network and the level shifter which are in front of the voltage amplifier this implies that the input signals which are applied to the input terminals of the transimpedance amplifier first pass the input biasing network and the level shifter before being applied to the voltage amplifier.

Figure 2:
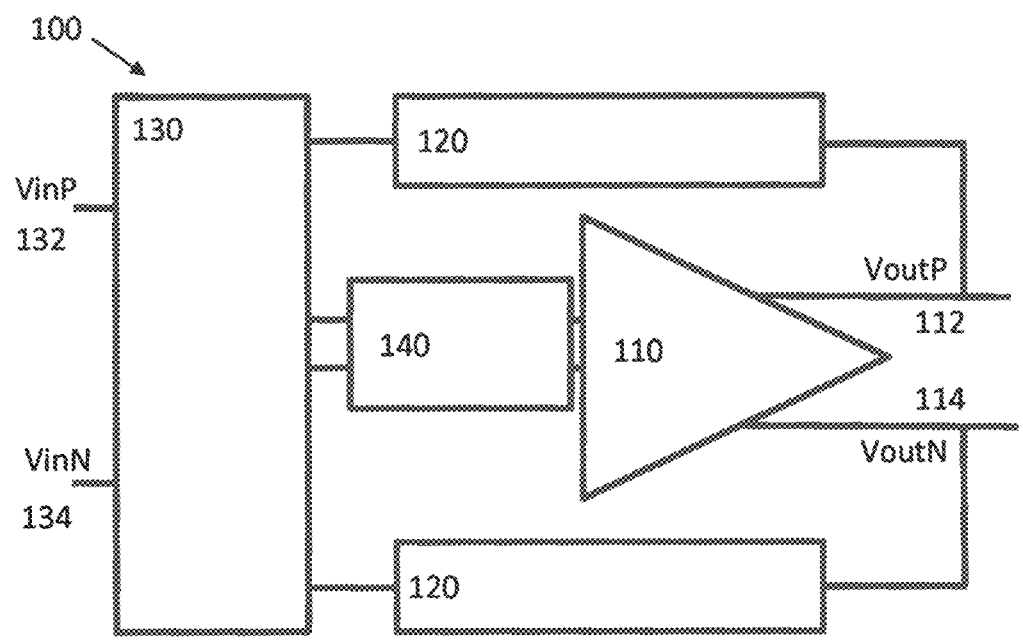
FIG. 2 shows a schematic drawing of a TIA in accordance with embodiments of the present invention.

In a first aspect embodiments of the present invention relate to a transimpedance amplifier for converting a current between its two input terminals VinP, VinN 132, 134 to a voltage over its two output terminals VoutN, VoutP 112, 114. A schematic drawing of such a transimpedance amplifier is shown in FIG. 2.

One of the input terminals is an inverting input terminal VinN 134, and the other one is a non-inverting input terminal VinP 132. The transimpedance amplifier comprises a voltage amplifier 110, a differential DC-coupled feedback network 120, an input biasing network 130, and a high-speed level shifter 140.

The level shifter 140 is configured for creating a difference in DC voltage between both inputs of the transimpedance amplifier and for being transparent for alternating voltages. In embodiments of the present invention the level shifter is positioned in front (e.g. at the input) of the amplifier. In embodiments of the present invention the level shifter is used inside the feedback loop. The input biasing network is configured for biasing a photodiode connected to at least one of the input terminals 132, 134 and is transparent for a feedback signal from the feedback network 120 which is positioned between the output terminals 112, 114 of the voltage amplifier 110 on one side and the biasing network and/or the level shifter on the other side.

The level shifter and the biasing network are in front of the voltage amplifier 110. The voltage amplifier is connected as a differential amplifier. This voltage amplifier is also referred to as an error voltage amplifier. The output terminals of the transimpedance amplifier 100 are corresponding with the output terminals of the voltage amplifier 110.

Thus, a fully differential, high-speed transimpedance amplifier with integrated on-chip photodiode biasing is obtained in which the high-speed level shifter, and the feedback network are transparent for DC and HF. It is an advantage that TIAs according to embodiments of the present invention are implemented differentially as this makes them less vulnerable to crosstalk and instability compared to the prior art single-ended implemented TIAs. This crosstalk may for example be originating from other TIA channels in a multi-TIA array or from the strong signals from the transmitter in a transceiver chip.

In embodiments of the present invention the feedback network 120 is an active feedback network. The feedback network allows the TIA to simultaneously provide high gain, high bandwidth, and low noise. In embodiments of the present invention the feedback network is a differential transimpedance feedback network. In embodiments of the present invention the feedback network is DC coupled and is capable of withstanding a DC voltage difference at the TIA input without causing a significant DC current difference through the transimpedance. Alternatively, the DC current difference may in some case be tolerated, in which case it is automatically provided by the input biasing network 130. In embodiments of the present invention the feedback network 120 may be integrated in the bias network 130.

In embodiments of the present invention the input biasing network 130, the level shifter 140, the voltage amplifier 110, and the feedback network 120 are transparent for DC and HF.

Figure 3:
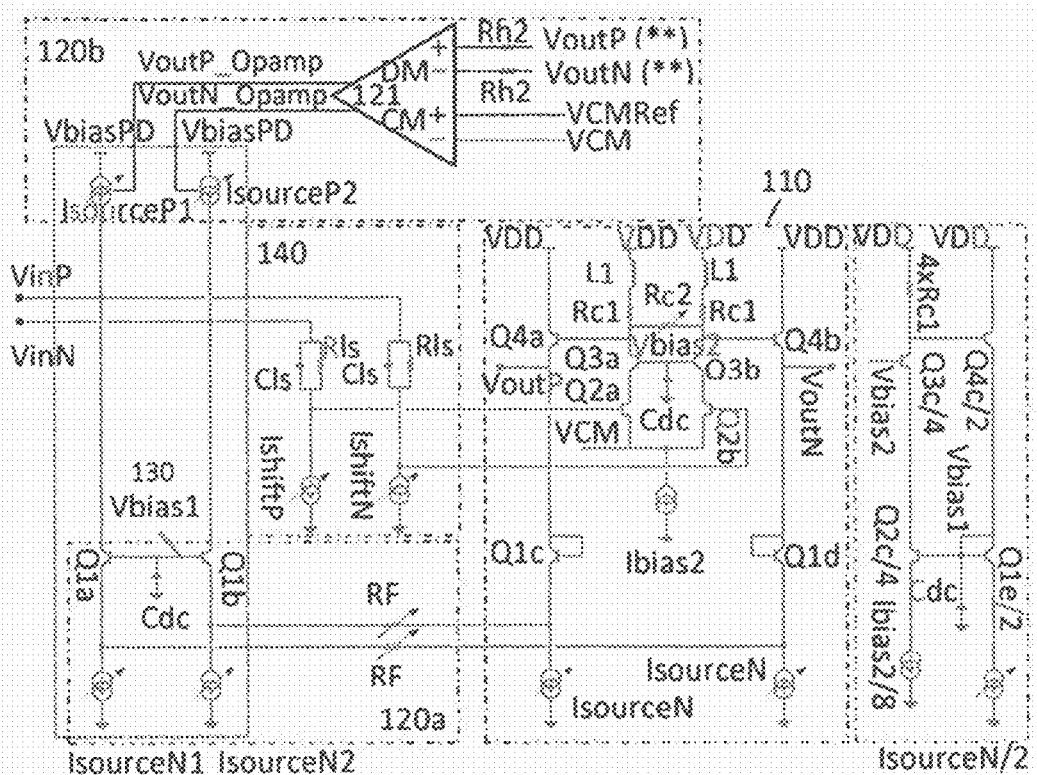
FIG. 3 shows a schematic drawing of a TIA comprising feedback resistors and current buffers in the feedback network.
Figure 7:
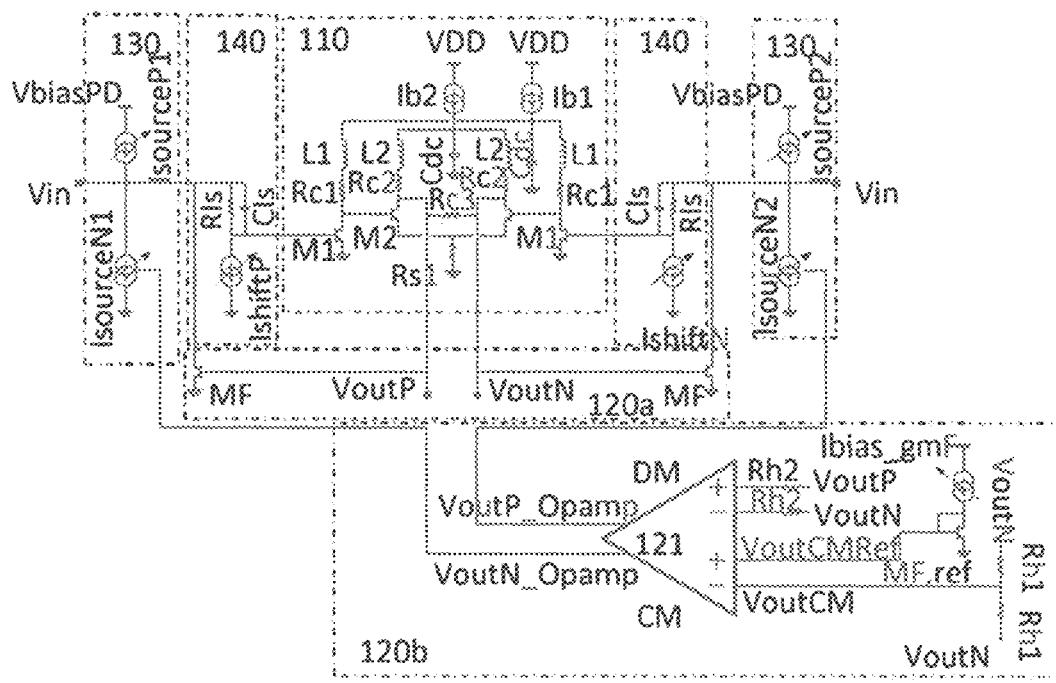
FIG. 7 shows a schematic drawing of a TIA comprising a feedback transistor in the feedback network in accordance with embodiments of the present invention.

FIG. 3 and FIG. 7 show two exemplary implementations of a TIA in accordance with embodiments of the present invention the first one is a more natural fit for BiCMOS while the second one is a more natural fit for CMOS and BiCMOS. Both can, however, be implemented in different technologies. A TIA according to embodiments of the present invention is not technology specific. It may for example be implemented in BiCMOS, CMOS, or GaAs.

The main structure of both is the same. Both are comprising an input biasing network 130, a low frequency feedback network 120b, a level shifter 140 before the voltage amplifier 110 (also referred to as an error voltage amplifier), and a high-speed feedback network 120a.

The low speed feedback network 120b is adapted to set Vout,differential (between VoutP and VoutN) to zero in DC, to compensate for the DC PD current and internal offsets. The low speed feedback network 120b is also adapted to set Vout,common-mode or a different common-mode voltage to an appropriate level (e.g. the common-mode voltage VCM is set to VCMRef). This is achieved using the common mode control integrated in the differential opamp 121.

The level shifter 140 is adapted to create a DC voltage difference while being linear, not bandwidth limiting and transparent in AC. In the examples, the level shifter 140 is implemented with an RC network, however, the invention is not limited thereto. The level shifter should be able to operate at high speed and should be linear. The level shifter should preferably be power efficient. A tunable level shift is also preferable.

In embodiments of the present invention, the biasing network 130 and the input level shifting allow to keep the TIA core (i.e. the voltage amplifier and the voltage buffers) which typically draws the most current, at the normal supply voltage, regardless of the reverse bias that is required for the photodiode. It is an advantage of embodiments of the present invention that the highest power supply is used only where it is needed, i.e. at the photodiode.

It is an advantage of embodiments of the present invention that no DC blocks are used.

In embodiments of the present invention the voltage amplifier 110 provides the loop gain for the high-speed feedback path.

The high-speed feedback network 120a is the defining property of a shunt-feedback TIA. It defines the transfer function of the TIA. In this concept, it must not be sensitive to a voltage difference at the input.

Some differences may be present in the feedback network depending on the implementing technology (e.g. CMOS and BiCMOS). The reason is that in CMOS, voltage buffers are preferably avoided (because of inferior performance w.r.t. BiCMOS buffers). Therefore, in CMOS active feedback is used. This allows to use a lower supply voltage and has no resistive loading of the output. In CMOS preferably, a transistor is used as feedback element whereas in the BiCMOS example in FIG. 3 a resistor is used, but is buffered under a current buffer (cascode) before connecting to the input.

In the example of FIG. 3, which is a design which best fits a BiCMOS implementation, the level shifting current is provided by the input biasing network 130. The current of the N-type current sources (IsourceN1,2) is reused to bias the current buffers (Q1a, Q1b) that buffer the transimpedance RF from the input. In this example, VbiasPD indicates the bias voltage for the PD. Depending on specifications, VbiasPD is higher than or identical to the main supply voltage VDD In this exemplary embodiment VbiasPD is 3V or 3.3V. Typically it is separate from the main analog supply to be able to measure the PD current accurately and to use the highest supply voltage (VbiasPD) only where it is needed, to save power. By locating the level shifter in front of the amplifier, the VbiasPD voltage is still only used in the input bias network, and the supply voltage of the TIA core (the error voltage amplifier) does not need to be increased.

VDD indicates the main analog supply voltage. In this example a main analog supply voltage of 2.5V is used.

The voltage amplifier 110 comprises transistors Q2 and Q3, resistors Rc1, Rc2 and inductors L1. This voltage amplifier is also referred to as the error voltage amplifier. It is biased by current source Ibias2.

In this example the voltage amplifier comprises voltage buffers Q4a, Q4b which are biased via current sources Ibias1.

The level shifter 140 comprises the RC pairs Rls, Cls, the current sources IsourceP1,2; the current source IshiftP at the VinP input terminal, and the current source IshiftN at the VinN input terminal.

The high-speed feedback network 120a comprises feedback resistors RF which are connected with the outputs of the voltage amplifier 110. The feedback resistors RF are connected to the input via current buffers Q1a, Q1b (biased via copies of IsourceN) to shield the input voltage difference from the feedback path and the output. The currents IsourceN1,2 is also used as part of the input biasing network. The current buffers reduce the effect of parasitic capacitance of RF, since the emitter of Q1 is a low-impedance point. The correct bias voltage Vbias1 for Q1a and Q1b may be set via a ¼-scaled dummy branch. Currents and transistors are ¼- or ½-scaled to reduce power consumption. In this exemplary embodiment of the present invention the created bias voltage Vbias1 is decoupled via a capacitor Cdc. Q1c and Q1d are added in the voltage amplifier 110 to match the voltages across the terminals of RF, which makes the DC current through RF zero. Thereby common mode current in the two RF's is avoided. Additionally, transistor Q2c/4 is added to make that the voltages over Ibias2 and Ibias2/8 are identical, improving the matching of Vbias1 with respect to the base voltage of Q1c/d. Therefore, the DC voltage over RF is 0 and the DC current through RF is 0.

This results in less (nominally 0) current in the tunable transimpedance, which is typically implemented as a combination of a resistor and parallel triode MOSFETS. These triode MOSFETS become non-linear when they conduct current. Therefore, zero DC current implies a more linear variable-transimpedance TIA.

The low frequency feedback loop comprises resistor Rh2 (connected to differential opamp 121) for sensing the output voltages VoutP (\*\*) and VoutN (\*\*). In this example (\*\*) denotes that these voltages can be the output voltages of this stage (=the input stage of the receiver), or output voltages of a later stage in the datapath (e.g. the output stage of the receiver, where loading is certainly not an issue).

In this example the controlled common mode voltage is not the output common mode (which is already set through VDD; Rc1 and Ibias2), but the voltage VCM at the emitters of Q2a and Q2b, to guarantee enough voltage headroom across current source Ibias2. This tunability can be exploited to tune the input common mode voltage at VinP and VinN. This can be used to provide a more equal (or intentionally unequal) bias voltage across the two photodiodes of a balanced photodiode configuration, resulting in better matching of these PDs (insufficient reverse bias increases the parasitic capacitance of the photodiode).

Figure 4:
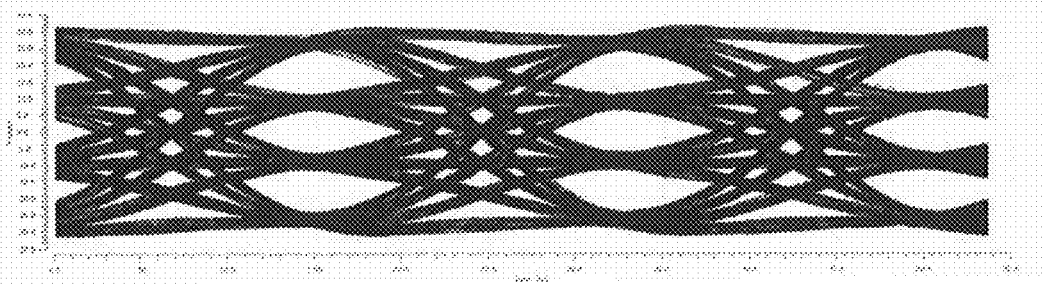
FIG. 4 shows the eye diagram when applying a 56 Gbaud PAM-4 (112 Gbit/s) signal to the input of the TIA which is illustrated in FIG. 3.

FIG. 4 shows the eye diagram when applying a 56 Gbaud PAM-4 (112 Gbit/s) signal. As can be seen an open eye is achieved at the TIA output, which is loaded by the following amplifying stage and estimated layout parasitics.

Figure 5:
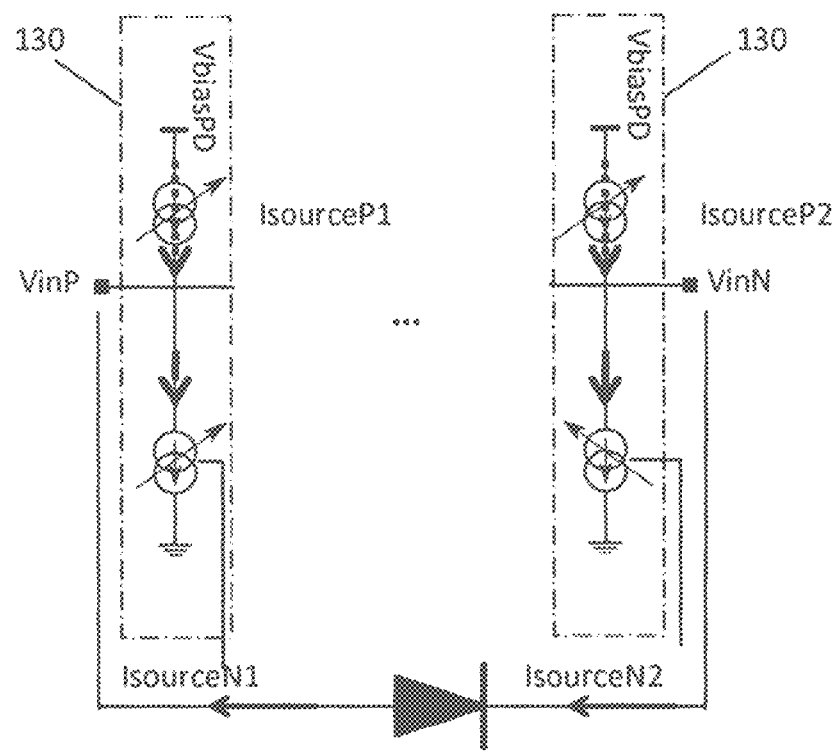
FIG. 5 shows an operation detail of an input biasing network in accordance with embodiments of the present invention.

FIG. 5 shows an operation detail of an input biasing network 130 in accordance with embodiments of the present invention. Each input terminal VinP and VinN is connected with two current sources. One for sourcing current (IsourceP1,2) and one for sinking current (IsourceN1,2). In this example, at each of the input terminals one of the current sources is programmable (in this example IsourceN1,2), the other current sources (IsourceP1,2) are tuned via the slow feedback network 120b. This allows to set the differential output voltage (Vout, differential) between the output terminals to zero in DC to compensate for the DC photocurrent and internal offsets, and it allows to set the output common mode voltage (Vout,common) to a reference value since this controls the current through the active feedback transistors. In the example of FIG. 5, when the programmable current sources IsourceN1,2 are programmed to generate a current of 3 mA, IsourceP1,2 at VinN is tuned to 4 mA and IsourceP1,2 at VinP is tuned to 2 mA if the photodiode draws 1 mA DC current. IsourceP1,2 also provide the current drawn by the level shifting sources IshiftP and/or IshiftN.

Figure 6:
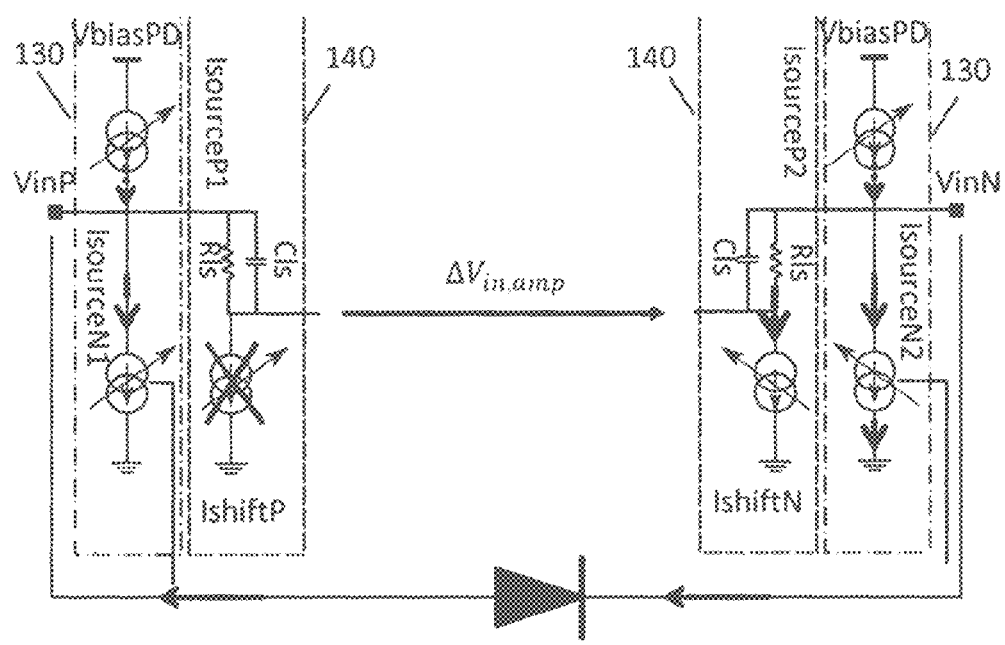
FIG. 6 shows a schematic drawing of a level shifter combined with an input biasing network in accordance with embodiments of the present invention.

FIG. 6 shows a schematic drawing of a level shifter 140 combined with an input biasing network 130 in accordance with embodiments of the present invention. The voltage difference ΔVin,amp is forced to 0 in DC by the (high-gain) low speed feedback path. If the DC voltage difference at the input of the voltage amplifier 110 is zero, then the DC voltage difference at the output is also zero (as desired). But IshiftN (generated by the current source of the level shifter at the VinN terminal) or IshiftP (generated by the current source of the level shifter at the VinP terminal) may force a tunable current through the resistor Rls of the corresponding level shifter and therefore a tunable voltage drop across Rls. For this reason and because ΔVin,amp is forced to 0, a voltage difference exists across the input terminals VinP and VinN, while the voltage difference at the output is zero and is not amplified by following stages. The current needed for level shifting may be provided by the same input biasing network (IsourceP)

In the CMOS example of FIG. 7, VbiasPD is the bias voltage for the PD. Depending on the specifications, this is higher than or identical to the main supply voltage VDD. VbiasPD may for example be in the range between 2V-2.5V. In embodiments of the present invention, the bias voltage is separate from the main analog supply to be able to measure the PD current accurately and to use the highest supply voltage (VbiasPD) only where it is needed, to save power.

VDD is the main analog supply voltage. This may for example be 1.5V.

M1, Rc1, L1 and M2, Rc2, Rc3, Rs1, L2 are respectively the first and second stage of voltage amplifier 110 (also referred to as the error voltage amplifier). Rc3 allows tuning of the differential gain without affecting common mode or the DC bias points.

The "supply" decoupling capacitors at the common nodes to the bias current sources are indicated by Cdc. The biasing current sources of the voltage amplifier are indicated by Ib1, Ib2.

The resistor, capacitor, current source of the level shifter at the VinP input terminal are indicated by Rls, Cls, IshiftP and those of the level shifter at the VinN input terminal are indicated by Rls, Cls, IshiftN.

The feedback transistor is indicated by MF. The transimpedance is the inverse of the transconductance gmF of this transistor. MF is a capacitive load for the output of the TIA. In CMOS, voltage buffers have less good performance and therefore the feedback resistor is often connected directly, but this loads the output resistively and again reduces performance (reduces loopgain and therefore results in worse bandwidth, or transimpedance and noise). This is avoided in this exemplary embodiment of the present invention via active feedback.

Common mode output voltage Vout,CM is also the common mode Vgs of the MF-transistors that form the feedback path. So, it defines the current through these transistors and therefore gmF. The reference for this voltage, VoutCMRef, is set by a third (scaled) MF transistor (MF,ref) and the current source Ibias_gmF in the low speed feedback network 120b This makes gmF continuously tunable.

VoutCMRef and VoutCM are connected to two input terminals CM of a differential opamp 121. Rh1 is a sensing resistor with a large value (e.g. 10 kOhm) in the low speed feedback network that allows to measure VoutCM. It has a high value to minimize resistive loading of the TIA output.

Rh2 senses the output voltages VoutP (\*\*) and VoutN (\*\*). Thereby (\*\*) denotes that these voltages can be the output voltages of this stage (=the input stage of the receiver)- or the output voltages of a later stage in the receiver datapath (e.g. the output stage of the receiver, where loading is not an issue). The resistors Rh2 are connected to two input terminals DM of the differential opamp 121.

In summary, in the example of FIG. 7, the low speed feedback network 120b is connected between the output of the voltage amplifier 110 and the input biasing network 130. The active feedback network 120a allows to generate significantly different DC voltages between both inputs (VinP vs. VinN) whereas this would not be the case if just a resistor would be connected. The low frequency feedback 120b allows to cancel the internal offsets and to cancel the PD DC current. This low frequency feedback can also be used to set the common mode voltage. This allows to continuously tune the transimpedance by setting a reference voltage (Vgs of MF,ref) and by tuning the output common mode voltage to that reference. The high-speed feedback network 120a in this example comprises a transistor (MF). This example is designed for a CMOS implementation and therefore a simple resistor is preferably not used instead of the transistor in the high-speed feedback network 120a. In embodiments of the present invention the function of the feedback network 120b is to balance the outputs. A DC difference may be present at the input. A DC difference should be avoided at the output, since the following stages will amplify this DC voltage and saturate, degrading performance severely. By implementing the feedback network 120a with MF, it is shielding the output from the input. A purely resistive feedback network without buffering cannot easily provide this shielding property.

In embodiments of the present invention the biasing network is also put in front of the amplifier. The biasing network may for example comprise two current sources per input of the TIA. One is used for sourcing the current (IsourceP1,2) and the other one for sinking the current (IsourceN1,2). In this example the level shifting current is also provided by the input biasing network.

Figure 8:
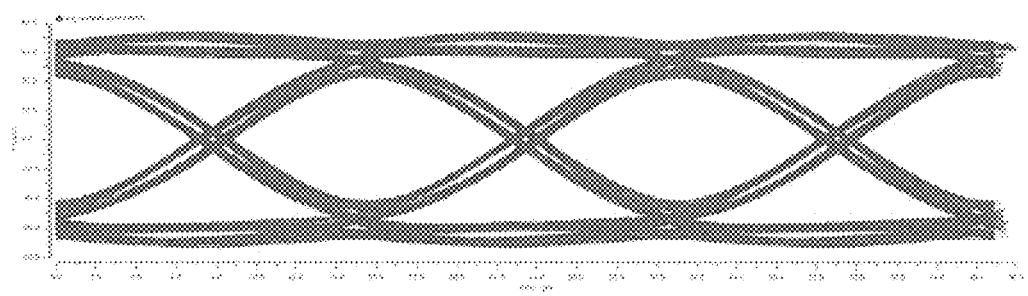
FIG. 8 shows an eye diagram when applying a 64 Gbit/s input signal to the input of the TIA which is illustrated in FIG. 7.
Figure 9:
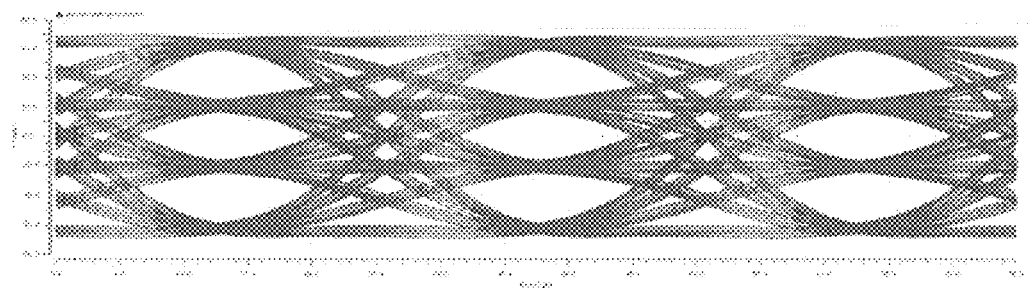
FIG. 9 shows the eye diagram when applying a 40 Gbaud PAM-4 (80 Gbit/s) signal to the input of the TIA which is illustrated in FIG. 7.

FIG. 8 shows an eye diagram when applying a 64 Gbit/s input signal to the input of the TIA which is illustrated in FIG. 7. FIG. 9 shows the eye diagram when applying a 40 Gbaud PAM-4 (80 Gbit/s) signal. The TIA output is loaded by the following amplifying stage and its layout parasitics. As can be seen in both graphs, an open eye is achieved at the TIA output.

A TIA in accordance with embodiments of the present invention compensates the current drawn from or pushed into either of the inputs. It cannot distinguish whether this current originates from a photodiode or from the current source of the level shifter (IshiftP, IshiftN). The biasing network does not assume any dependence between the VinP-input and the VinN-input. It can therefore correct for any configuration of photodiodes without assuming a degree of matching or correlation between these photodiodes.

It is an advantage of embodiments of the present invention that such a transimpedance amplifier can be used with multiple photodiode configurations. The input biasing network 130 is configured to sink or source the PD current(s) without degrading speed or noise performance. Although the anode typically receives most attention, the impedance at the cathode is not to be neglected. The effect of a long wirebond from the cathode to a bias pin Is very similar to a long wirebond from the anode to the Input, namely a bandwidth reduction. Therefore, the cathode is preferably connected directly to the TIA chip itself, to a bias voltage or a high voltage current mirror input, and is decoupled on-chip as well as locally off-chip.

Figure 10:
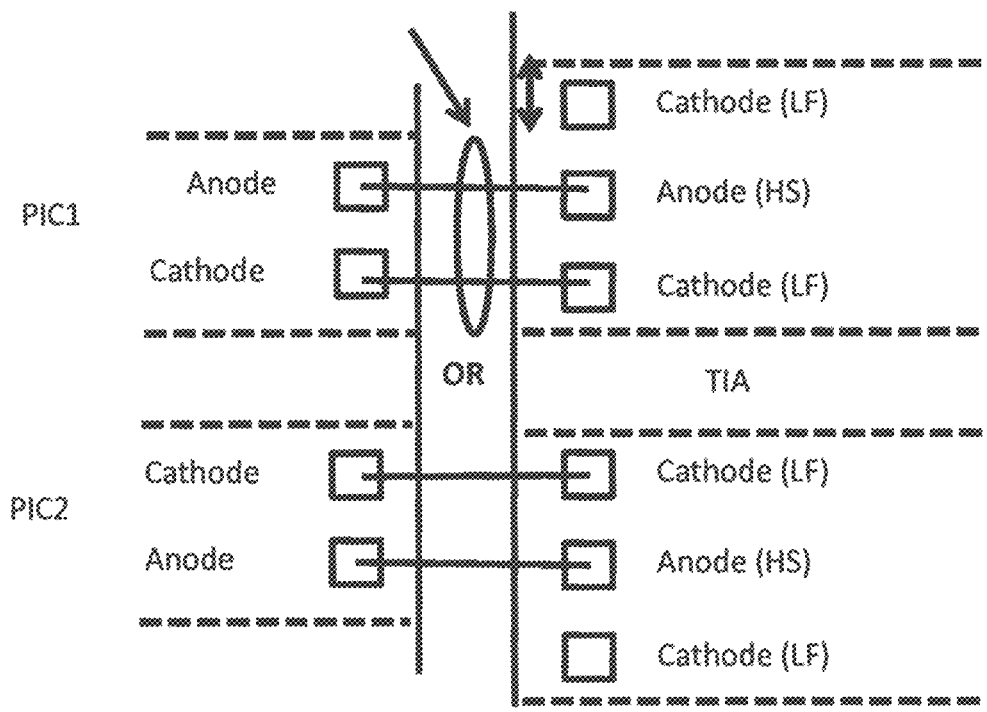
FIG. 10 shows prior art TIAs comprising 3 input pads connected with photonic ICs.

It is an advantage of embodiments of the present invention that it allows a flexible orientation of the photodiode. This advantage is illustrated by the prior art configuration shown in FIG. 10. The left-hand side shows the connection pads (anode/cathode) of a first photonic IC (PIC1) and of a second photonic IC (PIC2). As can be seen the connection PADs of the first PIC are the inverse of the connection PADs of the second PIC. As the photodiode needs to be reverse biased by the TIA, PIC and prior art TIAs need to be co-designed to align. Once co-designed, there is no flexibility to use the TIA with a different PIC with inversed PADs, unless such a prior art TIA has three input PADs as illustrated on the right side of FIG. 10. However, such an additional input PAD occupies unused space and forces the PD channel pitch to be 1.5 times larger. Moreover, the cathodes need to be shorted on chip which is not good for HF as it doubles the pad capacitance and creates asymmetry between the two inputs. Therefore, the cathode of such a TIA can only be used for LF. This is not the case in the present invention wherein each input terminal can source and sink current.

Between the two input terminals of the TIA, a photodiode can be connected. Thus, optical receivers according to a second aspect of the present invention can be obtained.

Figure 11:
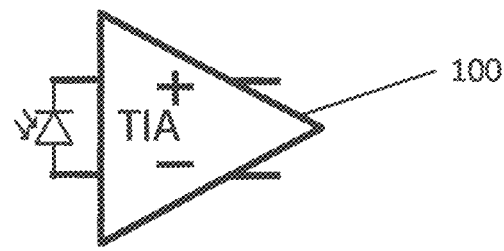
FIG. 11 shows a single PD differentially connected to a TIA in accordance with embodiments of the present invention.
Figure 12:
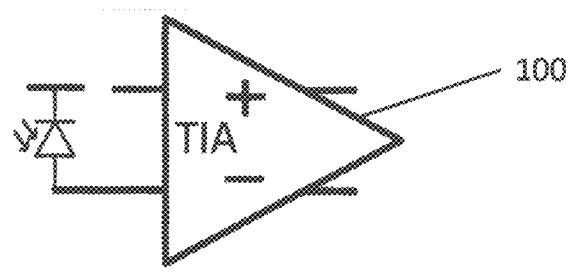
FIG. 12 shows a single PD which is single-ended connected to a TIA in accordance with embodiments of the present invention.

FIG. 11 and FIG. 12 show two single PD configurations connected to a TIA. In FIG. 11 the single PD is connected differentially to the TIA which has a programmable bias voltage. In this configuration the net gain is doubled with regard to the single-ended configuration. The high-speed photodiode capacitance (e.g. 20 fF) is, however, multiplied with a factor 2. However, the photodiode is not the only contributing capacitance at this input: the bondpad with ESD diodes (e.g. 30 fF), the input current source(s) (e.g. 20 fF) and the capacitance of the input transistors (e.g. 50 fF) contribute significantly as well. The total capacitance increase is therefore e.g. approx. 20%. FIG. 12 shows a single PD which is connected single-ended to the TIA. Such a configuration allows a programmable high bias voltage. In the differentially connected PD a max. 1.5 dB (optical) sensitivity gain can be achieved compared to this configuration.

The input biasing network 130 provides a DC current path for the photodiode current(s). The input biasing network 130 is adapted to source or to sink DC current to or from the photodiode. This allows to accommodate both photodiode orientations. In that case the biasing network also sources or sinks the DC current but the roles of the inputs of the TIA are interchanged. Each input of a TIA, in accordance with embodiments of the present invention, can both sink and source current. In embodiments of the present invention it is possible to sink or source up to 3 mA of current (less than 1 mA is required for level shifting). This current is sufficient both in coherent as well as in datacenter applications (maximum about 3 mA per PD is for example required for a coherent receiver with strong LO laser, or input signals with low ER).

The level shifter 140 is a differential level shifter at the input of the amplifier 110. It is DC coupled (i.e. without DC blocks) and is transparent for high frequencies. The level shifter 140 is adapted to generate a DC voltage between the two input terminals. The level shifter may be implemented as a current source and a parallel RC chain to generate a DC voltage between the two input terminals. In embodiments of the present invention the PD orientation is programmable, and the input bias voltage is tunable. A high range of programmable input bias voltages may be obtained. With 3.3V bias: [1.25V; 2.8V] (0.5V margin left for IsourceP1,2). Such a level shifter allows for example to apply 1.4 V reverse bias to a single photodiode of which both terminals are connected to the TIA for differential read-out as illustrated in FIG. 11. In the single ended configuration as illustrated in FIG. 12 for example 2.8 V of reverse biasing can be realized. It is moreover advantageous that this can be realized without using large high voltage transistors. It is for example still possible to use small, high-speed PMOS transistors in IsourceP1,2 at the input.

Figure 13:
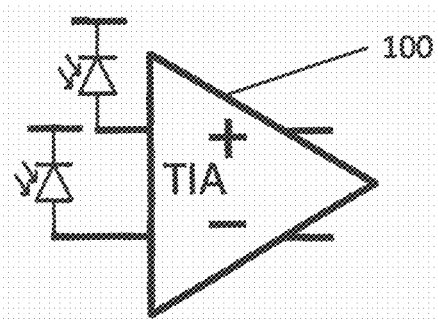
FIG. 13 shows two single photodiodes are connected in a single ended readout to a TIA in accordance with embodiments of the present invention.
Figure 14:
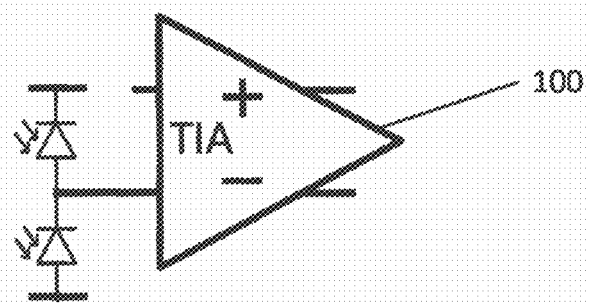
FIG. 14 shows a balanced PD configuration with a single-ended read-out of the PDs in accordance with embodiments of the present invention.

FIGS. 13 and 14 show two photodiodes connected to a TIA. In FIG. 13 two single photodiodes are connected in a single ended readout. A programmable bias voltage can be applied. In this configuration there is no restriction on matching of PDs. This configuration has a good power supply rejection ratio (PSRR)/common mode rejection ratio (CMRR), thanks to the large degree of symmetry. FIG. 14 shows a balanced PD configuration with a single-ended read-out of the PDs. A programmable bias voltage can be applied. In this configuration there is also no restriction on matching of PDs. This PD configuration results in (at least) a doubling of the photodiode capacitance as is also the case for a single-ended TIA with balanced PDs).

When a single photodiode is connected to both inputs of a TIA in accordance with embodiments of the present invention the level shifter allows to apply a DC voltage between both inputs of the TIA. This allows to reverse bias the photodiode. By connecting a single photodiode to the TIA the gain will be doubled and also a sensitivity gain of max. 1.5 dB (optical) can be achieved. This allows for example to reduce the output power of the laser in a link by 1.5 dB.

The photodiode can also be connected to one input. In that case it is possible to apply a relatively high reverse bias voltage to minimize the capacitance of the photodiode. TIAs according to embodiments of the present invention can also be used with two photodiodes as was discussed in the coherent case. As was discussed, TIAs according to embodiments of the present invention can also be used with balanced photodiodes.

TABLE 1

| | Only input stage (1)(*) | Full TIA(1) |
|---|---|---|
| Bandwidth | 43 GHz | 42.5 GHz |
| Gain | 55 dBΩ (560 Ω) | 70 dBΩ (3.2 kΩ) |
| Total power consumption | 80 mW | 160 mW (135 mW (**)) |
| Input ref. noise current | 4.2 uA, rms | 4.9 uA, rms |
| Sensitivity estimate, OMA (pp) (R = 0.8 A/W, NRZ, BER = 1e−12) | −11.3 | −10.6 |

(*)= input capacitance of next stage as load
(**) = without 50 Ω output buffer (=as in a real transceiver, where the next stage is for example an on-chip CDR)

Table 1 illustrates performance results of TIAs in accordance with embodiments of the present invention. In this example a 42 GHz of bandwidth can be achieved with a 70 dBΩ of gain, 160 mW of power, and 4.9 μA rms noise performance. This combination of specs is comparable with current state of the art TIAs which are designed for a single purpose and cannot be applied for all cited applications.

A TIA in accordance with embodiments of the present invention can be deployed in datacenter links as well as in coherent links and may be advantageous with regard to gain, bandwidth, power, and/or noise.

In a third aspect embodiments of the present invention relate to datacenter links comprising an optical receiver in accordance with embodiments of the present invention. Datacenter links may comprise a single photodiode (PD) or a multi-channel array of single photodiodes. In datacenter applications the minimal signal amplitude is determined by receiver noise. The TIA therefore needs to be a low noise TIA. A less noisy receiver with the same bandwidth allows to lower the laser power at the transmitter side or allows to reduce the signal swing at the transmitter side. In both cases the power consumption of the link is reduced. Decreasing the required power allows to decrease the need for cooling, resulting in even less power and in a longer lifetime of the laser. A transimpedance amplifier in accordance with embodiments of the present invention may for example be used for receiving 32, 56, 112 Gbit/s NRZ and PAM-4.

Figure 15:
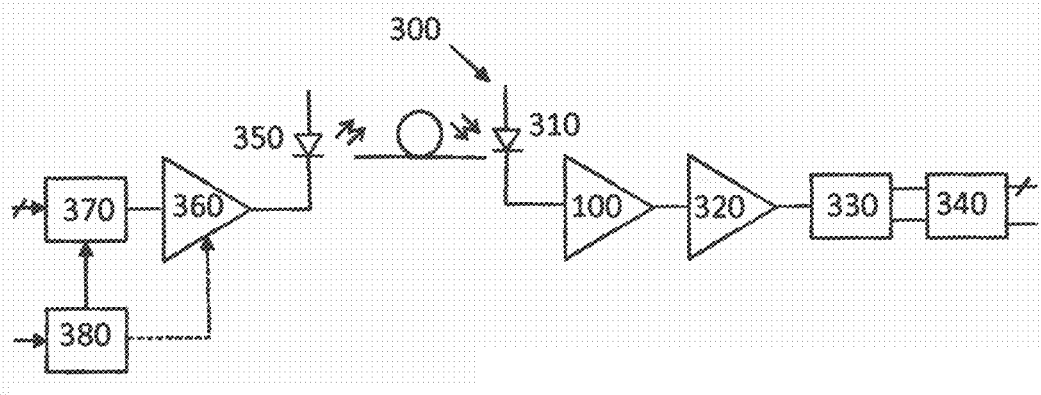
FIG. 15 shows a datacenter link which comprises a TIA in accordance with embodiments of the present invention.

In a fourth aspect embodiments of the present invention relate to a passive optical network (PON) comprising an optical receiver in accordance with embodiments of the present invention. The same advantages are applicable when using a TIA according to the present invention in a PON network. In datacenter and PON applications a single PD may be differentially read out. A datacenter link is for example disclosed in "Broadband circuits of optical fiber communication, E. Sackinger, ISBN: 9780471712336, p. 2". The TIA in such a datacenter link may be replaced with a TIA in accordance with embodiments of the present invention. Thus, a datacenter link in accordance with embodiments of the present invention is obtained. An exemplary embodiment of a datacenter optical link is illustrated in FIG. 15. At the receiving side it shows a photodiode 310 connected with a transimpedance amplifier 100. The transimpedance amplifier is connected with a limiting or automatic gain amplifier 320, of which the output is connected with a clock data recovery circuit 330, which outputs a data and clock signal towards a demultiplexer 340. In this example, at the transmit side it shows a clock multiplying unit 380 with outputs a clock signal from a n times slower clock wherein the input of the multiplexer 370 is an n-bit wide parallel datastream. The multiplexer is connected with a driver 360 which is connected with a laser diode 350.

TIAs according embodiments of the present invention are also suited for burst-mode by replacing the offset loop. A very slow offset loop or (fast) feed forward offset correction can be used to compensate the offset in the TIA itself. The currents in the bias network may be set by feedforward compensation instead of feedback. E.g. the level shift current is known beforehand and is constant; whereas both the DC PD current and the effect of (random) internal offsets can be derived from the output of the TIA and corrected for in a single calibration cycle at the start of the signal burst by choosing a pre-calibrated setting.

TIAs in accordance with embodiments of the present invention may also be applied in long haul networks, such as metro/access networks. They may also be applied for inter-datacenter communication. The TIA may for example be used for receiving 32/64 GBaud 16-QAM signals, in which case each TIA channel receives PAM-4. The total bitrate then amounts to 128/256 Gbit/s. By using both polarizations, the rate can be doubled to 256/512 Gbit/s. It is an advantage of embodiments of the present invention that the TIA, while providing two inputs with that can accommodate any PD configuration, can still have good noise performance. This implies that for the same signal-to-noise ratio (SNR), the LO laser power can be reduced, reducing power consumption.

Figure 16:
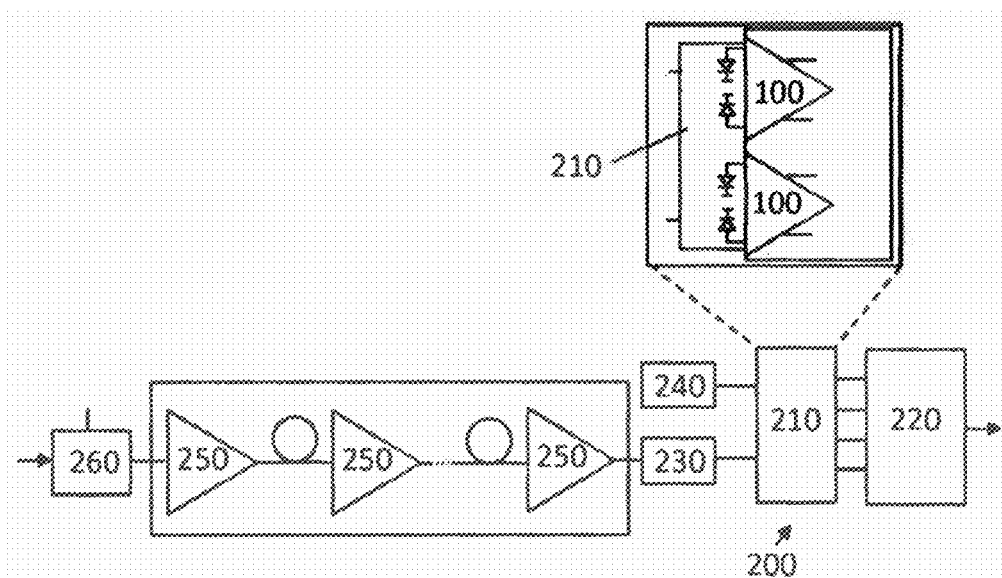
FIG. 16 shows a schematically drawing of an optical coherent optical receiver which comprises a TIA in accordance with embodiments of the present invention.

It is an advantage of embodiments of the present invention that a linear TIA can be obtained. This is particularly advantageous in coherent optical links. In such high-end systems PAM-4 and DSP are used to compensate for fiber dispersion and any (linear) impairment in the complete channel, such as e.g. bandwidth limitations in the transmitter or receiver. Such a DSP implementation is easier, and hence more power efficient, if the link is linear. Thus, a linear receiver is highly preferable. Coherent links may for example comprise 4 PDs per polarization (the 4 outputs of the optical hybrid are sent to 4 photodiodes). In coherent applications, the configurations may comprise balanced or unbalanced PDs; there is moreover no restriction on the photodiode matching. FIG. 16 shows a modified version of a prior art coherent optical receiver comprising TIA 100 in accordance with embodiments of the present invention. In the example the coherent optical receiver 200 comprises an optical hybrid 210, and 2 transimpedance amplifiers 100. A DSP 220 processes the signals from the transimpedance amplifiers 100. In the optical hybrid 210 the received optical signal is mixed with a local oscillator source. The outputs of the optical hybrid 210 are sent to 4 photodiodes which are connected with the input terminals of the TIAs 100. The outputs of the TIAs are connected with a DSP 220. The DSP 220 may be adapted for executing operations such as ortho-normalization, deskew, CD compensation, clock recovery, polarization demux, carrier recovery, democulation. In the example the signal input of the optical hybrid 210 is connected with a wavelength selective switch 230 and the oscillator input is connected with a local oscillator 240. In this example the optical signal is coming from an erbium doped fiber amplifiers (EDFA) 250. A plurality of EDFAs 250 may be connected in series. The input of the first EDFA 250 is coming from an IQ-demodulator 260.

In a sixth aspect embodiments of the present invention relate to an equalizer comprising a plurality of photodiodes arranged in a first array and in a second array differentially connected to the input terminals of a transimpedance amplifier in accordance with embodiments of the present invention.

An optoelectronic equalizer circuit is disclosed in U.S. Pat. No. 9,496,964B2. The optoelectronic equalizer in U.S. Pat. No. 9,496,964B2 does, however, not comprise a transimpedance amplifier which can both source and sink current at its input terminals.

In embodiments of the present invention the first array of photodiodes comprises a plurality of taps of photodiodes which are electrically connected with the non-inverting terminal of the transimpedance amplifier. The second array comprises a plurality of taps of photodiodes which are electrically connected with the inverting terminal of the transimpedance amplifier. Thus, a summation in the transimpedance amplifier is realized. Tap weights may be present per tap. These may be introduced at optical level. In embodiments of the present invention the tap weights have to be set optically, once the signal is converted into a current by the PD, the TIA cannot set a weight for each PD separately nor can it weight the PDs at the non-inverting terminal differently from the inverting terminal.

In embodiments of the present invention the first array of diodes comprises a plurality of diode pairs wherein the anode of one photodiode is electrically connected with the cathode of another photodiode at a connecting node. The cathode of the one photodiode is electrically connected with a supply voltage and the anode of the other photodiode is electrically connected with the ground. The connecting nodes are electrically connected with the non-inverting terminal of the transimpedance amplifier. Arranging the PDs in a balanced configuration, meaning each PD between supply and TIA input has another PD between that same input and ground, is an exemplary implementation. Other implementations are also possible. The equalizer and TIA will still work if one chooses to place only PDs to the supply and none to ground or vice versa.

The second array of diodes may have the same configuration as the first array. The connecting nodes of the first array are electrically connected with the inverting terminal of the transimpedance amplifier.

Figure 17:
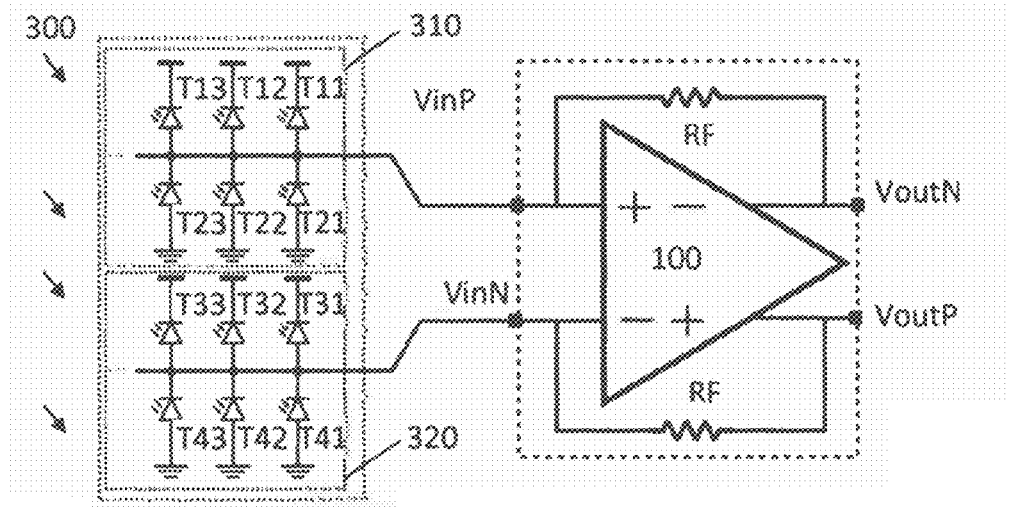
FIG. 17 shows an opto-electronic equalizer with summation in a differential TIA in accordance with embodiments of the present invention.

FIG. 17 shows an opto-electronic equalizer 300 with summation in a differential TIA. In the example illustrated in FIG. 17 the photodiodes T13, T23; T12, T22; T11, T21 are pairs of photodiodes of the first array 310 electrically connected with the non-inverting input terminal of the transimpedance amplifier. The photodiodes T33, T43; T32, T42; T31, T41 are pairs of photodiodes of the second array 320 electrically connected with the inverting input terminal of the transimpedance amplifier 100. As described in U.S. Pat. No. 9,496,964B2, the appropriate delay per PD is realized in the optical domain, where such a delay can be implemented in a passive, almost lossless, very high bandwidth way (e.g. optical waveguide spirals on the photonic IC).

In this example 3 pairs of photodiodes are shown on each input terminal. The invention is, however, not limited thereto (N PD's per input, N is a degree of freedom). Feedback resistors RF are connecting the outputs of the transimpedance amplifier with the inputs of the transimpedance amplifier.

The output voltage of the transimpedance amplifier in this example is:

$$Vout, TIA = RF * \sum_i ([IpdT1i - IpdT2i] - [IpdT3i - IpdT4i])$$

$$Vout, TIA = RF * \sum_i (IpdT1i + IpdT4i - IpdT2i - IpdT3i)$$

It is an advantage of embodiments of the present invention that the photodiode current summation has a better performance when doing it using a TIA in accordance with embodiments of the present invention that when using a resistor:
- a TIA can have a lower input referred current noise (50 Ω: 18 pA/sqrt(Hz), but this is without the input referred noise of the active stages (with 50 Ω input impedance) that read out the PD.
- a TIA has a transimpedance of up to 3-4 kΩ (instead of 25Ω)
- When implementing this type of opto-electronic equalizer with a TIA topology as demonstrated in FIG. 3 or 7; all combinations of tap weights are allowed, regardless of their relative tap weight, delay or total optical input power. If the tap weights are (continuously) adapted, e.g. because an LMS (least-mean-squares) loop is used to determine the tap weights that are optimal for the complete optical link; the biasing circuits directly automatically compensate all changes to keep all photodiodes correctly reverse biased, independent of the optical input power (within the predetermined range of e.g. max. 3 mA DC current per TIA input VinN or VinP). The stages after the TIA do not perceive any change in DC level or operating conditions. This is not the case when a single resistor is used as a TIA; where changing the net DC current influences the output DC voltage that is read out by the next stage.

It is moreover advantageous that each input terminal of a TIA in accordance with embodiments of the present invention can source and sink current. This is particularly advantageous because the direction of the average photodiode current is not known in advance. Especially not if the feed forward equalizer tap weights are introduced and if all combinations of these tap weights and signs are allowed.

Once the photodiode orientation and placements is fixed, the sign of the taps relative to each other is fixed, but the sign of the total signal is of no importance since it can easily be corrected for before or after the TIA.

Since a differential TIA subtracts the currents at the two inputs, twice as much feed-forward equalizer (FFE) taps can be used compared to a single-ended TIA, while keeping the bandwidth and gain the same.

Alternatively, the same number of taps can be preserved but with half the number of taps per input. This allows for a higher bandwidth with the same gain, or a higher gain with the same bandwidth.

Such an equalizer in accordance with embodiments of the present invention can be applied in datacenter and in coherent links.

Figure 18:
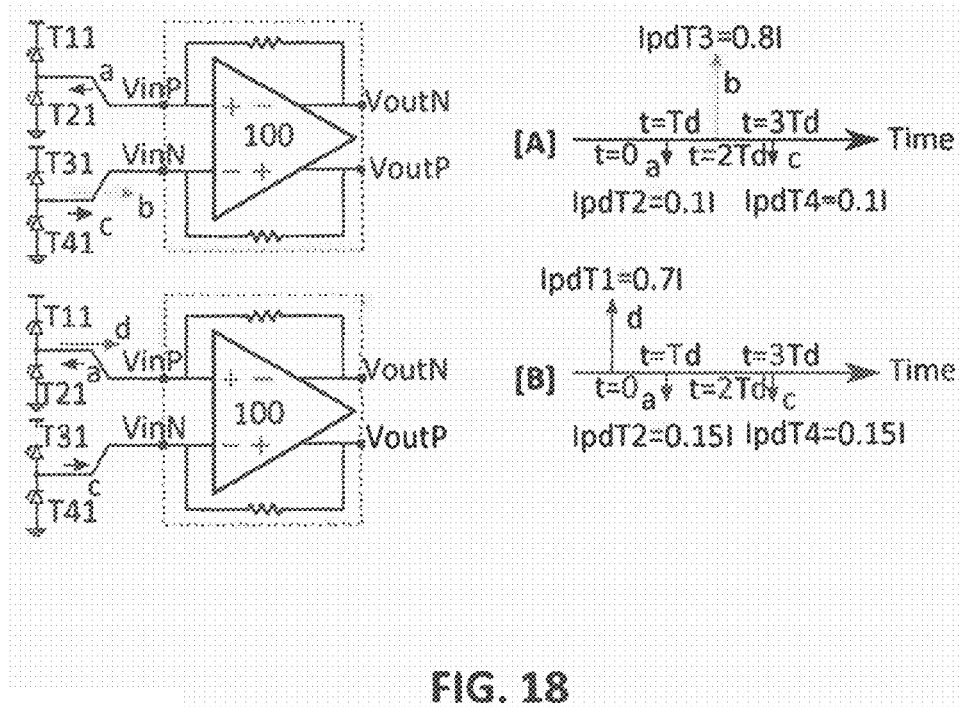
FIG. 18 shows a 4-tap feed-forward equalizer in an IMDD datacenter link in accordance with embodiments of the present invention.

FIG. 18 shows a 4-tap FFE in an IMDD (intensity modulation, direct detection) datacenter link.

The top graph shows a time sequence with one precursor (a) of 0.1 I at moment Td and one postcursor (b) of 0.1 I at moment 3 Td and one main signal 0.8 at moment 2 Td. The electrical consequence thereof is that the non-inverting input terminal VinP of the transimpedance amplifier needs to source 0.1 I, whereas the inverting input terminal VinN needs to sink 0.9I.

The bottom graph shows a time sequence with main signal (d) of 0.7 I at moment 0, one close postcursor (a) of 0.15 I at moment Td, and one further postcursor (c) of 0.15 I at moment 3 Td. The electrical consequence thereof is that the non-inverting input terminal VinP needs to sink 0.55 I, whereas the inverting input terminal needs to sink 0.15 I.

Figure 19:
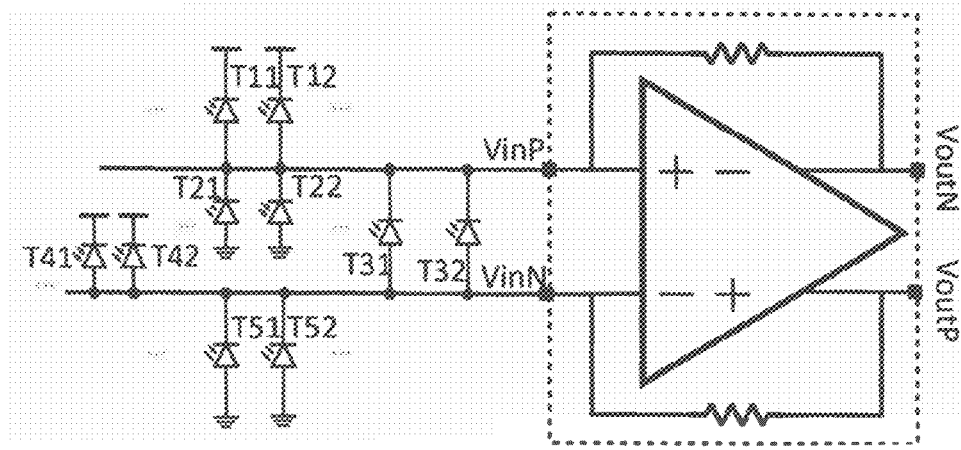
FIG. 19 shows a coherent receiver where each unbalanced PD is a 2-tap FFE PD in accordance with embodiments of the present invention.

It is an advantage of embodiments of the present invention that a PD can be differentially read out using a TIA in accordance with embodiments of the present invention. FIG. 19, for example, shows another multi-PD configuration, where the output voltage of the TIA is determined as:

$$V_{out,TIA} = R_F * \sum_i (T_{1i} - T_{2i} - T_{3i} - (T_{4i} - T_{5i} + T_{3i}))$$

After simplification (the overall sign is of no significance):

$$V_{out,TIA} = -R_F * \sum_i (2T_{3i} - T_{1i} + T_{2i} + T_{4i} - T_{5i})$$

Figure 20:
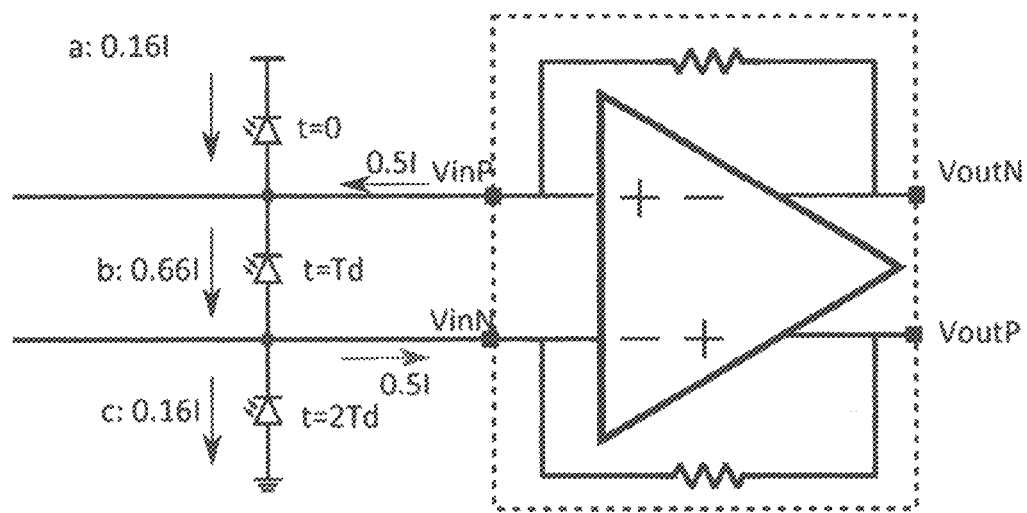
FIG. 20 shows a schematic drawing of a TIA in accordance with embodiments of the present invention wherein the main tap is placed in between both PDs.

By placing photodiodes ($T_{3i}$) in between VinP and VinN, their tap weight is doubled without requiring more optical input power, but the capacitance of those PDs is doubled as well. For the same degree of equalization, this implies that the optical power sent to the other taps needs to double. Two advantages arise from this configuration:
- The current into or from the TIA is reduced since the current for the main taps is now partially provided by the equalizing taps. Only the DC current that is proportional to the equalized signal current enters the TIA. This feature can extend the range of optical powers that can be handled by the receiver beyond the nominal input range of the TIA. This advantage depends on the chosen tap weights and their sign; however, in a typical configuration, where lowpass channels are to be compensated, the main tap is compensated by taps with opposite sign, resulting in a dynamic range improvement in DC. This allows to make the input current sources smaller, then they contribute less parasitics.
- An improved signal-to-noise ratio can be obtained. In FIG. 18[A], a total optical power P results in a total current I, divided among a main tap of 0.8 I and two side taps, each 0.1 I: the ratio of the main taps w.r.t the side taps is a factor 8. In FIG. 20, the main tap is placed in between both PDs, which doubles its gain without requiring extra optical power. Therefore, dividing the current as [I/6, 4 I/6, I/6] again results in a relative tap ratio of 8:1 since the contribution of the middle tap is effectively doubled, to 8 I/6. The configuration of FIG. 18[A] has a low frequency (LF) "gain" of 0.8 I−2*0.1 I=0.6 I; where as in FIG. 20; the low frequency gain is 2*(4 I/6)-2*I/6=I. FIG. 18[A] offers equalization at the cost of reduced SNR, as is the case in all traditional feedforward equalizers when equalizing low-pass channels. The configuration of FIG. 20 however, offers feedforward equalization virtually without loss in signal-to-noise ratio. Very mild degrees of equalization (tap ratio >8) can even be obtained with improved SNR. This is otherwise impossible to obtain; and also impossible to obtain without differential TIA with a differential read-out of the photodiode.
- A minor penalty in FIG. 20 resides in the doubling of the capacitance of the PD that is connected in between both terminals. However, when multiple PDs are used already to implement the opto-electronic equalizer, the relative penalty is minimal ((N+1)Cpd instead of N*Cpd for N taps, where the main tap is placed in between both inputs). Additionally, as described before, the PD capacitance is only one of the contributions to the input capacitance (bondpad, ESD, at least one current source, input transistor . . . )

A comparison between FIG. 18[A] and FIG. 20 is given in Tables [Table2], [Table3] and [Table4], using the same 3-tap example (precursor, main cursor, postcursor), with identical pre- and post-cursor. This configuration is often used because it results in a linear phase filter with flat group delay, while still providing amplitude peaking.

TABLE 2

Results for 3-tap FFE settings in the configuration of FIG. 18.

| Tap1 | Tap2 | Tap3 | Tap ratio | LF "gain" | SNR change (in LF, dB20) | Max. absolute I, DC from/to TIA |
|---|---|---|---|---|---|---|
| 0.0833 | 0.833 | 0.0833 | 10 | 0.666 | −3.53 | 0.75 |
| 0.1 | 0.8 | 0.1 | 8:1 | 0.6 | −4.4 | 0.7 |
| 0.15 | 0.7 | 0.15 | 4.66 | 0.4 | −7.95 | 0.55 |
| 0.2 | 0.6 | 0.2 | 3 | 0.2 | −13.97 | 0.4 |
| 0.25 | 0.5 | 0.25 | 2 | 0 | −"∞" | 0.25 |

TABLE 3

Results for 3-tap FFE settings in the configuration of FIG. 20.

| Tap1 | Tap2 current | Tap3 | Effective Tap2 | Effective Tap ratio | LF "gain" | SNR change (in LF, dB20) | Max. absolute I, DC from/to TIA |
|---|---|---|---|---|---|---|---|
| 0.143 | 0.714 | 0.143 | 1.428 | 10 | 1.142 | +1.15 | 0.57 |
| 0.166 | 0.666 | 0.166 | 1.332 | 8 | 1 | 0 | 0.494 |
| 0.23 | 0.54 | 0.23 | 1.08 | 4.69 | 0.62 | −4.15 | 0.31 |
| 0.285 | 0.43 | 0.285 | 0.86 | 3 | 0.29 | −10.75 | 0.145 |
| 0.33 | 0.33 | 0.33 | 0.66 | 2 | 0 | −"∞" | 0 |

TABLE 4

Comparison of the 3-tap FFE configurations of FIG. 18 and 20.

| Effective tap ratio | ΔSNR FIG. 20 w.r.t FIG. 18[A] (dB 20) | Δ[max. abs. I, DC] FIG. 20 w.r.t. FIG. 18[A] | Δ[max. abs. I, DC], relative |
|---|---|---|---|
| 10 | +4.68 | −0.18 | −24% |
| 8 | +4.4 | −0.206 | −29.5% |
| 4.66 | +3.8 | −0.24 | −44% |
| 3 | +3.22 | −0.255 | −64% |
| 2 | — | −0.25 | −100% |

As shown in Table 4; the configuration of FIG. 20 offers significantly improved signal-to-noise ratio while also improving the DC current range of the TIA.

Figure 21:
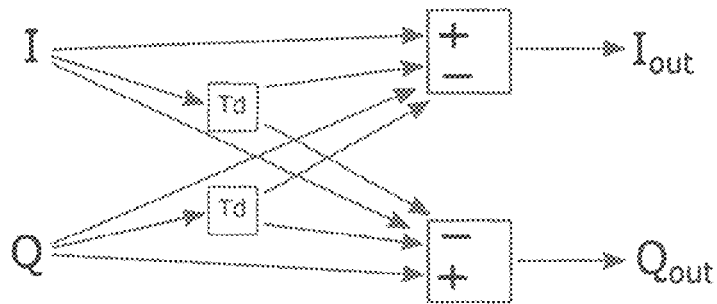
FIG. 21 shows the concept of an IQ-equalizer for coherent optical links or RF links.

FIG. 21 shows the concept of an IQ-equalizer for coherent optical links or RF links. A 2-tap FFE configuration is shown here. The input signals, I and Q, are delayed and in principle, all linear combinations of direct and delayed inputs, including crossover-taps from I to Q or vice versa, can be added linearly to obtain the equalized outputs $I_{out}$ and $Q_{out}$.

Figure 22:
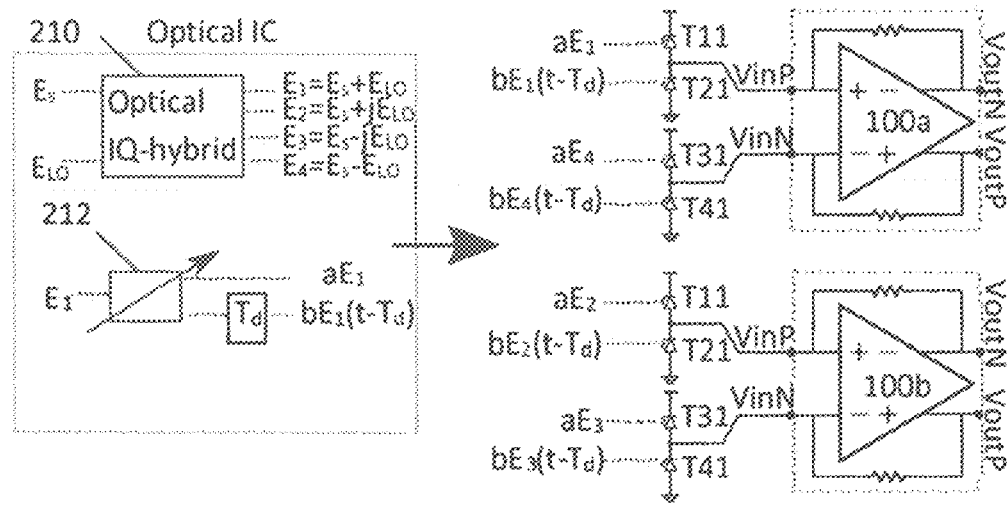
FIG. 22 shows an implementation of the concept of FIG. 21 without crossover-taps.

FIG. 22 shows an implementation of this concept without crossover-taps. This is a normal coherent receiver where each unbalanced PD is replaced by a 2-tap FFE PD. In this example, the coherent receiver comprises an optical IC, a plurality of photodiodes and two TIAs.

The optical IC comprises an optical IQ hybrid 210 which mixes an optical signal $E_s$ with a local oscillator $E_{LO}$. Thus, 4 signals are obtained ($E_1=E_s+E_{lo}$, $E_2=E_s+jE_{lo}$, $E_3=E_s-jE_{lo}$, $E_4=E_s-E_{lo}$). Each of these outputs is connected with a delay element 212 resulting in signals $aE_i$ and $bE_i(t-Td)$ for i between 1 and 4.

In this example one photodiode per input of the TIAs 100a and 100b can be used for the usual coherent signals (=the unbalanced coherent PD-case), while the other PD at each input can be used as an FFE tap.

For each transimpedance amplifier a first photodiode T11 is connected with its cathode to the supply voltage and with its anode to the cathode of a second photodiode T21, which is connected with its anode to the ground. The connecting node is connected to the non-inverting input terminal of the TIA.

A third photodiode T31 is connected with its cathode to the supply voltage and with its anode to the cathode of a fourth photodiode T41, which is connected with its anode to the ground. The connecting node is connected to the inverting input terminal of the TIA.

The coherent receiver is configured such that for the first TIA 100a, $aE_1$ is supplied to T11, $bE_1(t-T_d)$ to T21, $aE_4$ to T31, $bE_4(t-T_d)$ to T41 and such that for the second TIA 100b, $aE_2$ is supplied to T11, $bE_2(t-T_d)$ to T21, $aE_3$ to T31, $bE_3(t-T_d)$ to T41

FIG. 22 shows how this equalizer can be implemented with the TIA, using all of the features as discussed here above.

$$E_1 = \tfrac{1}{2}(E_s+E_{LO}) \rightarrow i_1 = \tfrac{1}{4}(|E_s|^2+|E_{LO}|^2+2|E_s||E_{LO}|*\cos(\Delta\omega t+\Delta\varphi))$$

$$E_2 = \tfrac{1}{2}(E_s+jE_{LO}) \rightarrow i_2 = \tfrac{1}{4}(|E_s|^2+|E_{LO}|^2+2|E_s||E_{LO}|*\sin(\Delta\omega t+\Delta\varphi))$$

$$E_3 = \tfrac{1}{2}(E_s+jE_{LO}) \rightarrow i_3 = \tfrac{1}{4}(|E_s|^2+|E_{LO}|^2+2|E_s||E_{LO}|*\sin(\Delta\omega t+\Delta\varphi))$$

$$E_4 = \tfrac{1}{2}(E_s+E_{LO}) \rightarrow i_4 = \tfrac{1}{4}(|E_s|^2+|E_{LO}|^2+2|E_s||E_{LO}|*\cos(\Delta\omega t+\Delta\varphi))$$

$$I = |E_s||E_{LO}|*\cos(\Delta\omega t+\Delta\varphi)) = i_1 - i_4$$

$$Q = |E_s||E_{LO}|*\sin(\Delta\omega t+\Delta\varphi)) = i_2 - i_3$$

FIG. 22 illustrates an example: $i_1$ and $i_4$ contain the information on I, $i_2$ and $i_3$ and $i_4$ contain the information on Q. The first two terms in all currents contain are common, undesired contributions, and need to be cancelled.

Figure 23:
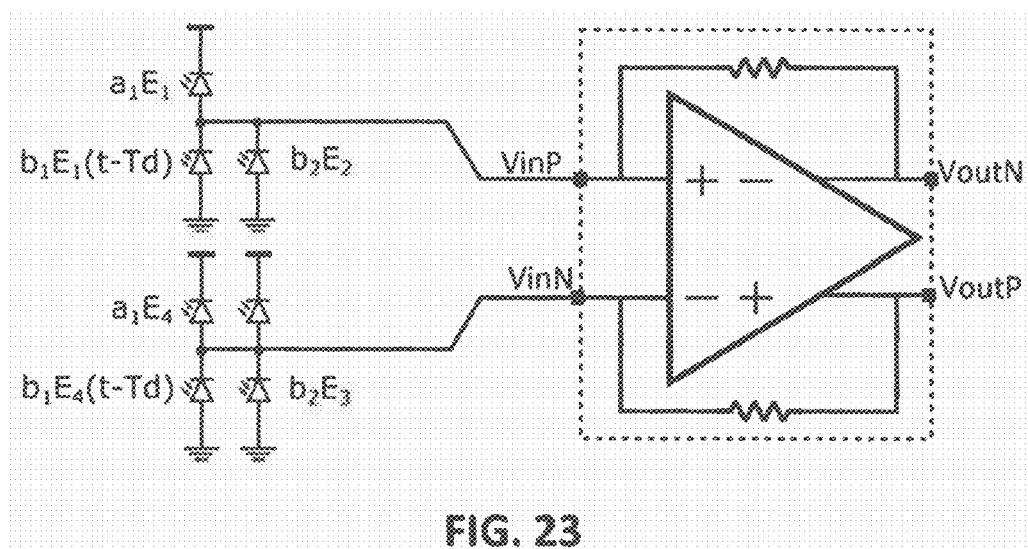
FIG. 23 shows an implementation wherein the crossover-taps that link I and Q are implemented by placing a photodiode that receives $E_2$ at VinP and a PD that receivers $E_3$ at VinN.

In FIG. 23, the crossover-taps that link I and Q are implemented by placing a photodiode that receives $E_2$ at VinP and a PD that receivers $E_3$ at VinN. Another photodiode draws a current proportional to $b_1E_1(t-T_d)$ from VinP, while $b_1E_4(t-T_d)$ is drawn from VinN. The undesired terms have an amplitude $a_1-b_1$ at VinP and VinN; but since the TIA only amplifies the current difference between VinP and VinN, they do not appear in the output. The undesired terms also appear delayed by $T_d$, with amplitude of $b_1$, at VinP; but also at VinN; therefore, they also cancel. The same applies to FIG. 22.

The invention claimed is:

1. A transimpedance amplifier for converting a current between its two input terminals,
    wherein one of the input terminals is an inverting input terminal and the other one is a non-inverting input terminal, to a voltage over its two output terminals, the transimpedance amplifier comprising a voltage amplifier, a differential DC-coupled feedback network, wherein DC-coupled implies transparent for DC, an input biasing network, and a high-speed level shifter, wherein the output terminals of the transimpedance amplifier are corresponding with output terminals of the voltage amplifier,
    and wherein the level shifter is configured for creating a tunable difference in DC voltage between the input terminals and for being transparent for alternating voltages, and wherein the input biasing network is configured for reverse biasing a photodiode or multiple photodiodes connected to at least one of the input terminals and comprises two current sources per input terminal, one configured for sourcing current to the photodiode and one configured for sinking current from the photodiode and is transparent for a feedback signal from the differential DC-coupled feedback network, the differential DC-coupled feedback network is differentially and DC-coupled with the output terminals of the voltage amplifier and outputs of the differential DC-coupled feedback network are differentially and DC-coupled with the input biasing network and outputs of the input biasing network are coupled with inputs of the level shifter and the level shifter is differentially and DC-coupled with input terminals of the voltage amplifier.

2. The transimpedance amplifier according to claim 1 wherein the level shifter comprises a current source and a parallel RC chain which are configured for generating a DC voltage between the input terminals of the voltage amplifier.

3. The transimpedance amplifier according to claim 1 wherein the differential DC-coupled feedback network is an active feedback network.

4. An optical receiver comprising the transimpedance amplifier according to claim 1, and at least one photodiode wherein the at least one photodiode is connected to at least one of the input terminals of the transimpedance amplifier.

5. The optical receiver according to claim 4 wherein the photodiode is connected to both input terminals of the transimpedance amplifier.

6. The optical receiver according to claim 4 wherein the photodiode is connected to the inverting or non-inverting input terminal of the transimpedance amplifier.

7. The optical receiver according to claim 4 wherein one photodiode is connected to the inverting input terminal of the transimpedance amplifier and another photodiode is connected to the non-inverting input terminal of the transimpedance amplifier.

8. The optical receiver according to claim 4 wherein one photodiode is connected with its anode to the inverting input terminal of the transimpedance amplifier and another photodiode is connected with its cathode to the same inverting input terminal of the transimpedance amplifier.

9. A datacenter optical link comprising the optical receiver in accordance with claim 4.

10. A passive optical network comprising the optical receiver in accordance with claim 4.

11. A coherent optical receiver comprising the optical receiver in accordance with claim 4.

12. An equalizer comprising the transimpedance amplifier according to claim 1, and a plurality of photodiodes arranged in a first array connected to the non-inverting input terminal of the transimpedance amplifier and in a second array connected with the inverting input terminal of the transimpedance amplifier.

* * * * *